United States Patent [19]

Fosnough et al.

[11] 4,112,376
[45] Sep. 5, 1978

[54] RADIO CHANNEL DISPLAY AND METHOD OF DISPLAY

[75] Inventors: Robert D. Fosnough; Max A. Nelson, both of Logansport, Ind.

[73] Assignee: Controls, Inc., Logansport, Ind.

[21] Appl. No.: 728,272

[22] Filed: Sep. 30, 1976

[51] Int. Cl.² .......................... H03J 1/04; H04B 1/16
[52] U.S. Cl. .............................. 325/455; 116/124.1 R; 325/25; 334/86; 340/107; 340/202; 340/336
[58] Field of Search .................. 325/15, 16, 21, 25, 325/176, 312, 455, 390, 391, 393, 461; 334/86, 87; 358/192; 340/202, 107, 336, 378 R; 116/124.1 R, DIG. 29, DIG. 31; 40/129 C, 28 C, 28 D, 130 E, 130 J; 313/113-115

[56] References Cited

U.S. PATENT DOCUMENTS

| 2,452,384 | 10/1948 | McDonald, Jr. | 325/393 |
| 3,707,941 | 1/1973 | Kunishige et al. | 325/455 |
| 3,750,138 | 7/1973 | Burgan et al. | 340/97 |
| 4,032,844 | 6/1977 | Imazeki | 325/25 |
| 4,048,561 | 9/1977 | Wilcox et al. | 325/22 |

OTHER PUBLICATIONS

CB Channel Billboard — Popular Electronics — Oct. 1976, p. 18.
Cassette Mobile Radios MRU08 and MRU1-6-AB-SONAB, Data and Summary Sheet, Jun. 19, 1975.

Primary Examiner—Robert L. Griffin
Assistant Examiner—Marc E. Bookbinder
Attorney, Agent, or Firm—Albert L. Jeffers

[57] ABSTRACT

A digital readout device for use in a motor vehicle having a manually adjustable channel-indicating control mounted in accessible relationship to the vehicle operator. A digital display device is remotely positioned from the control interiorally of the vehicle and has a two digit illuminated panel. The panel is affixed to an interior vehicle surface adjacent a vehicle window so that it will face outwardly of the vehicle and be visible to persons exteriorally of the vehicle and in particular to operators of vehicles in the near vicinity. A flat wire connector having a connectable harness intermediately thereof provides electrical communication between the control and the display device. The construction of the control and display devices each include an extruded channel structure. The channel is designed to provide a secure, camming action against the components of the control and the display device to hold them in secure, vibration-free position relative the vehicle, with the components being slidably assembled in the extruded portions.

6 Claims, 9 Drawing Figures

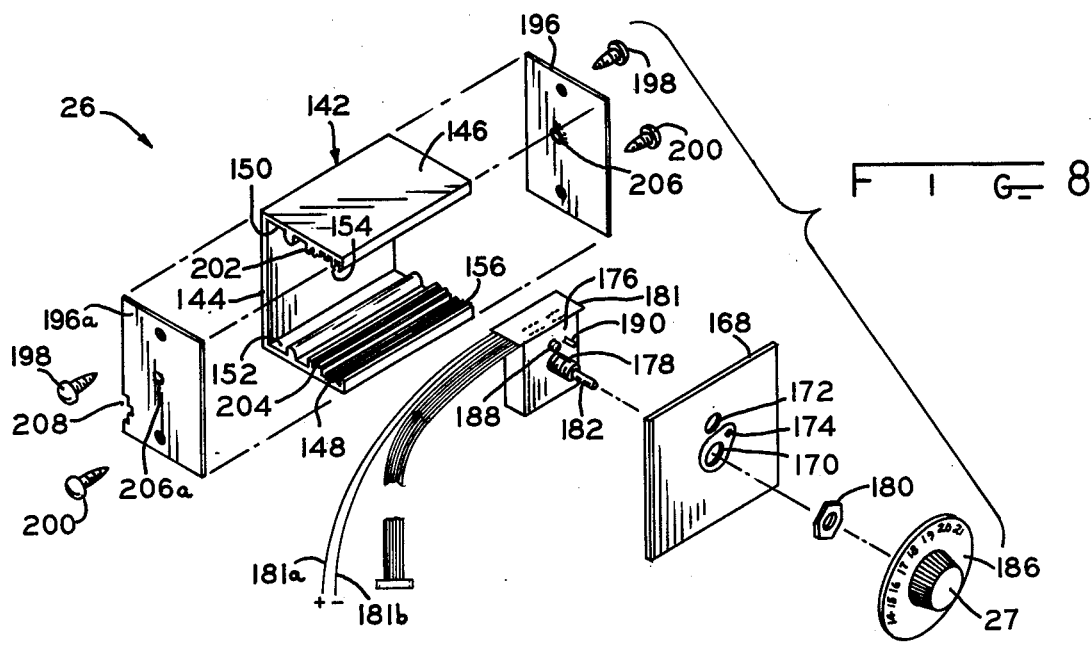
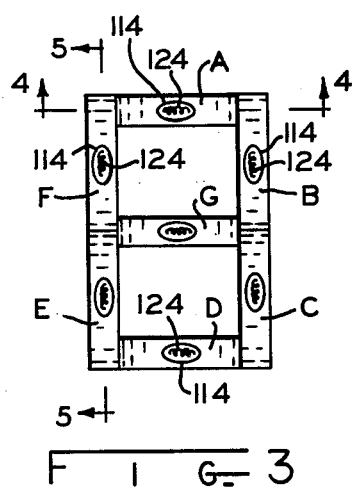
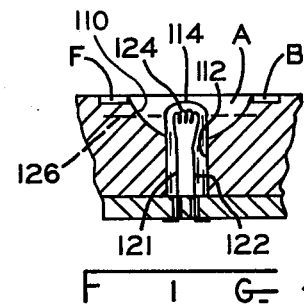
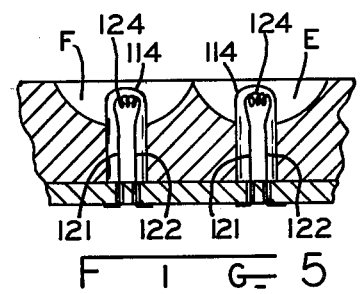
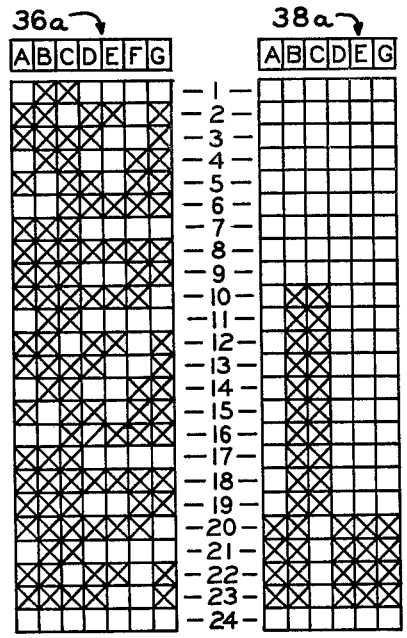

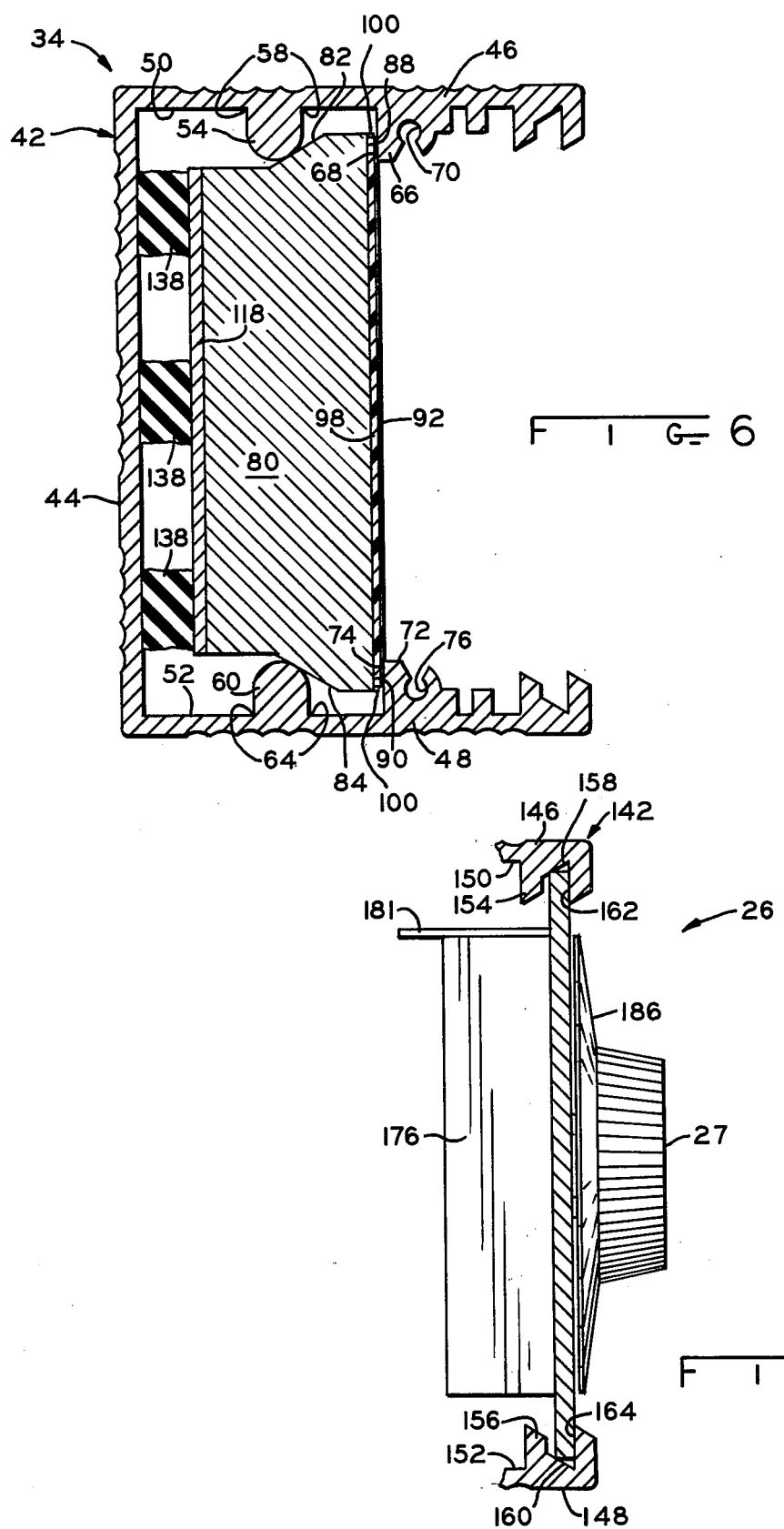

RADIO CHANNEL DISPLAY AND METHOD OF DISPLAY

BACKGROUND OF THE INVENTION

1. Field of the Invention

This invention is in the field of CB (Citizen's Band) channel display devices and more particularly to a device which is remotely located from a manually adjustable channel indicating control and is readily visible to operators of CB radios in the near vicinity of the display.

2. Description of the Prior Art

CB radios have recently become extremely popular and a very large segment of the CB radio market is for those radios to be mounted in and operated from motor vehicles, and in particular commercial and passenger automobiles and trucks. A prime objective in such installations is economy of manufacture and versatility of use. A major benefit of CB radios is communication with other CB operators who are within the range, which is limited by governmental restrictions, of the vehicle mounted CB unit. Further, a relatively large number of CB channels, recently increased from 23 to 40, are available to the CB operator and therefore it has required considerable searching of the channels to communicate with adjacent operators of CB units, which can be identified by the recognizable CB antenna mounted to an exterior vehicle surface, in order to communicate with such adjacent operators.

SUMMARY OF THE INVENTION

A channel-shaped switch housing having a base and two generally parallel sides extending laterally from the base is mounted to the underside of a vehicle dashboard in accessible position to the vehicle operator. The housing sides have opposing faces and an elongated groove is formed in each of said faces with the groove openings being opposite and parallel. Each groove bottom or bed is slanted relative to the respective groove walls. A switch plate having opposed parallel edges is seated in the grooves, with the edges being forced by the slanted beds towards a groove wall to securely hold the plate, in vibration-free relation, in the groove. A rotary switch having a plurality of discrete positions, with each position representing a separate CB channel, is mounted on the switch plate.

A second channel-shaped housing having a base and two generally parallel sides extending laterally from the base is mounted interiorally of the vehicle, for example, on the rear seat shelf in a passenger vehicle, with the open end of the channel facing the rear window. The parallel sides have opposing faces and each face has an elongated camming bar affixed to the respective face along a longitudinal bar surface and parallel to the channel base. Each bar has an arcuate camming cross-section. A second elongate bar is positioned on each opposing face and is generally parallel to and transversely spaced from the camming bar on that face. Each of the second bars has an abutment surface which is in facing relation to its respective camming bar.

A reflector plate has two seven segment digit displays with each segment comprising a concave surface having a parabolic cross-section. Formed centrally in each concave surface is an opening for receiving a lamp having an elongate lamp filament therein, which filament is positioned substantially parallel to the directrix of the parabola when the lamp is inserted in the opening. A lamp support having a plurality of pedestals protruding therefrom on which the lamps are mounted is placed against the reflector plate so that the lamps are accurately positioned in their respective openings.

The reflector plate has at opposite edges thereof two parallel convexly formed camming surfaces which are engageable with the camming bars, respectively, on the housing to force the reflector plate towards the abutment surfaces. A light conducting display panel is placed between the plate and the abutment surfaces and is forced in cammed securement against the abutment surfaces when the camming bar and camming surfaces are engaged. The channel sides overhang the display panel and are blackened in order to provide a shadowbox effect so that the digital display, when illuminated, may be read in daylight as well as at nighttime. A flat wire cable having a separate conductor for each segment of each digit connects the rotary switch with the illuminated segments. Each position of the rotary switch selectively illuminates the segments in each digit display to provide a display of the particular digit selected by the rotary switch. Thus, a relatively low cost, easily assembled, brightly illuminated display is provided for representing a selected CB channel.

Therefore, it is an object of this invention to provide a remotely placed, low cost, high intensity illumination for representing one of a plurality of CB channels.

A further object is to provide in a device of the previous object displays which are particularly adaptable to motor vehicle installation.

A still further object of this invention is to provide in the devices of the previous objects a channel display which was common, multi-function, components in both has switch and display housings to further reduce cost of manufacture.

The above-mentioned and other features and objects of this invention and the manner of attaining them will become more apparent and the invention itself will be best understood by reference to the following description of an embodiment of the invention taken in conjunction with the accompanying drawings.

BRIEF DESCRIPTION OF THE DRAWINGS

FIG. 3 is a front elevational view of a digit display on the reflector plate;

FIG. 4 is a section taken at 4—4 of FIG. 3;

FIG. 5 is a section taken at 5—5 of FIG. 3;

FIG. 6 is a section taken through the display housing with the components assembled therein;

FIG. 7 is a table indicating the rotary switch connections for digits in numerals 1 to 23;

FIG. 8 is an exploded perspective view of a housing for containing the rotary switch; and FIG. 9 is a partial section of a housing having the rotary switch mounted therein.

DESCRIPTION OF THE PREFERRED EMBODIMENT

Figure 1:
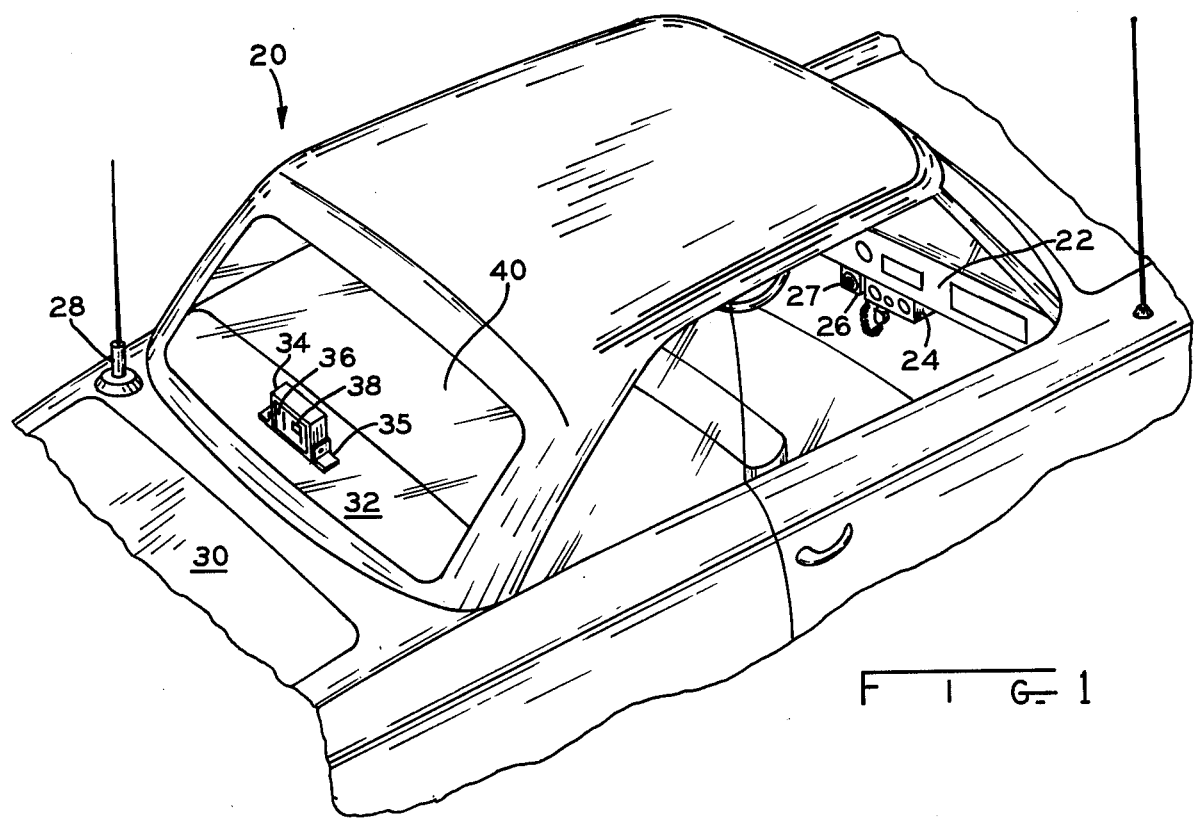
FIG. 1 is a partial, perspective view of a passenger vehicle having a device of this invention mounted therein.
Figure 2:
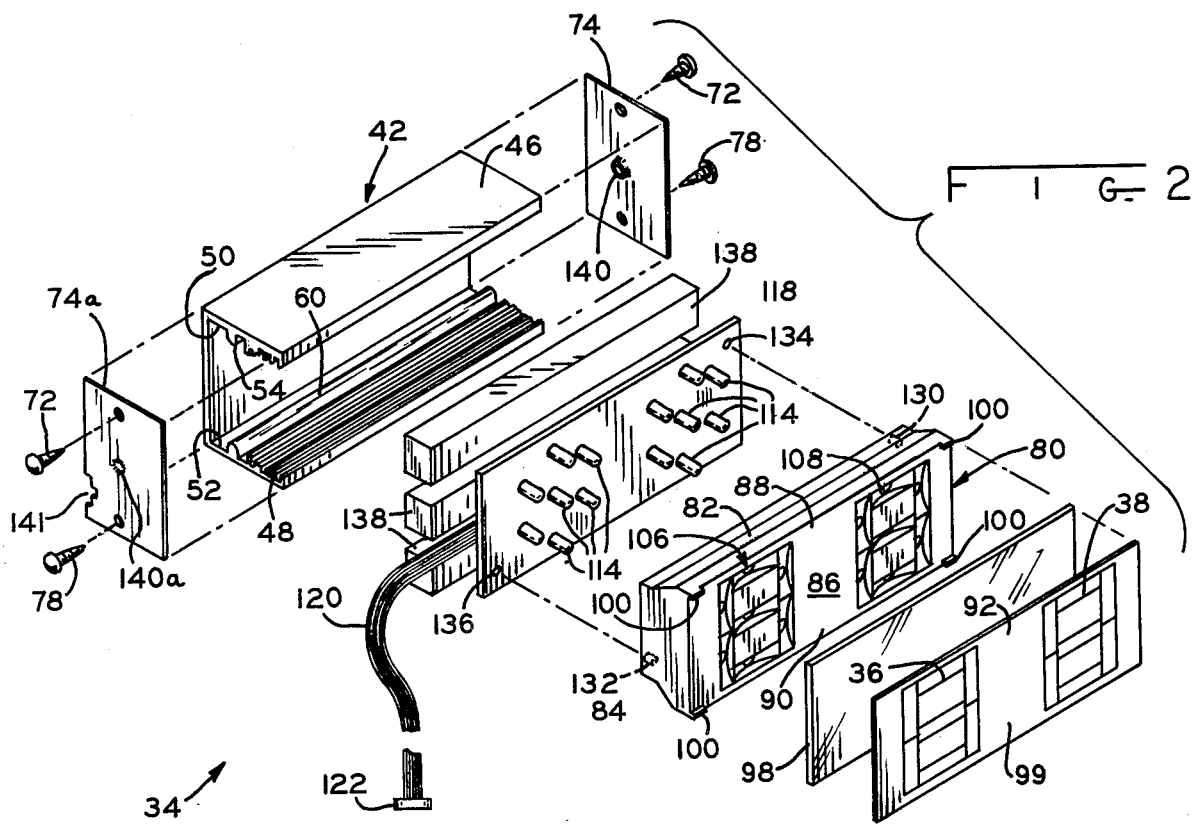
FIG. 2 is an exploded view in perspective of a housing for containing the digital displays.

Referring to the drawings, in FIG. 1 a passenger vehicle 20 has a dashboard 22 mounted interiorally thereof in the operator compartment. Mounted under dashboard 22, is a CB radio 24 and adjacent to radio 24 is a switch housing 26 mounted to the dash by means of brackets, not shown, and having knob 27 rotatably mounted therein. A CB antenna 28 is mounted on the vehicle rear deck 30. Mounted interiorly of vehicle 20 on the rear seat shelf 32, is a display housing 34 which has two digit displays 36, 38 which are mounted to face rearwardly and are visible exteriorly of the vehicle through window 40. A multi-faced display housing may be associated with the antenna 28 or otherwise placed on the vehicle. As will become apparent, adjustment of rotary knob switch 27 will cause the display digits 36, 38 to change accordingly. Switch 27 is manually adjusted to correspond the channel to which radio 24 is set. While in the disclosed embodiment, rotary switch 27 is manually adjusted, it is to be understood that it could also be automatically adjusted through mechanical gearing or ganging to the switches in radio 24 or by electronic connection to the channel selecting switch in radio 24.

Referring now to FIGS. 2-6, housing 34 comprises a channel shaped extrusion 42, which is made of an extruded aluminum and is anodized a dull black on all surfaces thereof, has a base 44 from which laterally extends sides 46, 48. Side 46 has innerface 50 and side 48 has innerface 52. Formed on face 50 (FIG. 6) is elongated camming bar 54 which has a rounded camming surface 56 and is substantially parallel to base 44 and protruding from face 50 along longitudinal lines 58. Similarly formed on face 52 is camming bar 60 having an arcuate camming surface 62 formed thereon. Bar 60 is formed oppositely bar 54 and is parallel to base 44 and protrudes from face 52 at longitudinal lines 64. Also formed on face 50 is a second elongate bar 66 having an abutment surface 68 formed thereon in parallel relation to bar 54 and facing camming surface 56. Bar 66 has apertures 70 at each end for receiving mounting screws 72 to secure end plates 74, 74a to housing 42. Formed on wall 52 opposite the bar 66 is bar 72, similarly constructed to bar 66, having abutment surface 74 formed thereon in parallel relation to bar 60 and spaced transversely therefrom. Bar 72 also has apertures 76 at each end thereof for receiving mounting screws 78 to aid in securing end plates 74 and 74a to extrusion 42.

An elongate reflector plate 80, which may be a metallic die casting, has elongate concave camming surfaces 82, 84 at opposite edges thereof. Surfaces 82 and 84 are chamfered in cross-section and engage respectively camming surfaces 56 and 62 when plate 80 is mounted in extrusion 42. Front face 86 has longitudinal upper edge 88 and lower edge 90 which are registrable, respectively, with abutment surfaces 68 and 74 and are urged theretoward when plate 80 is mounted in extrusion 42. A light transmitting panel 98 has a plastic label 99 having a textured surface affixed thereto, as with a transparent adhesive. Label 99 is printed opaque except for the seven segments of each of digits 36, 38. Panel 99 and/or label 99 may be of an amber tint to provide an amber display. Alternatively, a light transmitting panel which is made of an amber colored plastic such as Plexiglass or Lucite, is silk-screened, or otherwise coated, to expose two seven segment digits 36, 38. An indexing lug 100 is formed in each corner of plate 80 and protrudes therefrom to receive and index panel 98 in proper registration with plate 80.

Plate 80 has formed therein two separate digit displays 106, 108, each of which corresponds to the display shown in FIGS. 3 to 5. Referring to FIGS. 3 to 5, a seven segment display is shown having segments A, B, C, D, E, F and G which can represent all ten digits by selective illumination of the segments as is well known in the art and which is illustrated in the chart of FIG. 7. Each segment is concavely contoured as shown in FIG. 4 having a parabolic surface 110 following the curve $X = AY^2$ wherein the constant $A = 2$. Formed centrally of each segment is an opening 112 for receiving a lamp 114 supported on a printed circuit board 118. Each lamp 114 has a filament 124 having two leads 120, 122 which pass through board 118, one of the leads 120, 122 being electrically connected to a corresponding conductor flat wire cable 120 which has fourteen separate electrical conductors each terminating in a female socket individually and insulatively supported by an insulative harness 122. The number of separate conductors depends on the particular digits to be displayed. The other of the leads 120, 122 of each filament 124 is connected to a vehicle power supply and the circuit to the power supply is completed when the filament is selected by the rotative position of knob 27. Seven conductors are connected to the bulbs for digit display 106 and seven conductors are connected for the digit display 108.

The filament 124 of each lamp 114 is wound along an axis 126 which is parallel to the directrix of, and in the plane of, parabola 110 and which preferably passes through the focus of parabola 110. This positioning of filament 124 has been found to produce a significantly brighter display than would be expected by so aligning filament 124. Axis 126 may be slightly curved for desired results. Plate 80 has two alignment pins 130, 132 for insertion alignment openings 134, 136, respectively, in support 118 for proper alignment between support 118 and plate 80. Foam rubber strips 138, which may be made of any resilient material, are placed between support 118 and base 44 of extrusion 42.

In assembly of the components into extrusion 42, panel 98 is placed against the front face 86 of plate 80, and against and within indexing lugs 100, respectively. Bulbs 114 are then inserted into their respective holes or openings 112 in plate 80 and alignment pins 130, 132 are inserted respectively in alignment holes 134, 136. Strips 138 are placed against base 44 and sides 46 and 48 are slightly spread and the assembled support 118, plate 80, and panel 92 are laterally slid between sides 46 and 48 so that camming surfaces 82 and 84 respectively engage camming surfaces 56 and 62 and the front face of panel 92 engages at its upper and lower edges abutment surfaces 68 and 74. Sides 46 and 48 are then released and allowed to assume their normal positions at which time strips 138 will be slightly compressed to maintain support 118 in vibration-free supported engagement with plate 80. Due to the camming action between surfaces 56 and 82 and surfaces 62 and 84, plate 80 and panel 92 are firmly held in vibration-free engagement in extrusion 42. The resilience of sides 46 and 48 maintain this engagement throughout the use of the display. End plates 74, 74a are then secured to extrusion 42 by the threading of screws 72 and 78 into their respective openings 70 and 76 in extrusion 42. Each plate 74, 74a has a threaded opening 140, 140a, respectively, for receiving mounting brackets 35 (FIG. 1), for securement of housing 34 to an interior vehicle surface such as shelf 32. Since the interior surfaces of extrusion 42 are blackened, the display has a "shadow-box" effect wherein the direct rays of the sunlight will not impinge upon or be reflected into the display panel 92, thus providing panel visibility even in bright sunlight.

The housing for switch 26 will now be described. Referring to FIGS. 8 and 9, a channel shaped extrusion 142, which is identical in cross-section to extrusion 42, has sides 146, 148 which are connected to a base 144. Sides 146 has innerface 150 and side 148 has innerface 152. Elongate grooves 154, 156 are formed respectively in the forward edges of faces 150, 152 with the groove openings being parallel and opposed. Grooves 154, 156 have bottoms or beds 158, 160, respectively, which are in slanted relation to the groove walls 162, 164, respectively.

A mounting plate 168 has a central opening 170, a lamp opening 172, and an alignment opening 174. A rotary switch 176, which is commercially available from Standard Grigsby Co., Division of Kollsman Instrument Corp, 920 Rathbone, Aurora, Illinois, Part No. 1006 PREL-24-1 PC-262, has an externally threaded tubular stub 178 extending centrally from the forward face thereof, which is insertable through opening 170 and which receives in threaded engagement nut 180. A printed circuit board 181 has leads 181a and 181b which are connected to the vehicle battery. Keyed shaft 182 is rotatably supported in stub 178. Knob 27 having a light transmissive flange 186 extending from the periphery thereof is marked with numerals corresponding to radio channel numbers, has a keyed opening, not shown, for receiving shaft 182 as is well known in the art. A lamp 188 is mounted in switch 176 and is insertable in opening 172 and registrable with the channel numerals on flange 186. Lamp 188 is illuminated by a vehicle power source, not shown. Alignment pin 190 is insertable in opening 174 to align switch 176 to plate 168 and prevent relative rotation therebetween. A flat wire cable 192 having 14 individual conductors which are energized in accordance with the chart on FIG. 7 for providing a signal in accordance with the selected rotative position of shaft 182 by knob 27. The individual conductors in wire 192 terminate in male connectors which are individually insulatively secured in insulative harness 194 which is pluggable into harness 122 with the male connectors insertable into the corresponding female sockets to cause appropriate illuminations of lamps 114 thus providing a digital display corresponding to the rotative position of knob 27. In this regard, for the digit "1" the segments B and C are illuminated in display 36, with segments B and C in the chart 36a of FIG. 7 opposite the numeral 1 having an "X" placed thereunder opposite numeral 1. The vehicle power source, not shown, is connected to one terminal of each filament 124 and a circuit is completed through the filament when it is selected by knob 27. In like manner, the segment illuminated for each of the numerals 123 are shown in FIG. 7. Any number may be represented, and while only 23 numbers are shown in the chart of FIG. 7, this would be expanded to 40 with the recent additional allotment of 17 channels by the FCC to the Citizen's Band. The numeral on flange 186 of the particular channel selected is opposite lamp 188 and is thus illuminated and made visible to the vehicle operator.

End plates 196, 196a are similar to plates 74 and 74a and are attached to extrusion 142 by the threaded connection between fasteners 198 and 200 in extrusion 142 openings 202, 294, respectively, as explained for extrusion 42.

In the assembly of the components in extrusion 142, switch 176 is placed against mounting plate 168 with stub 178 being inserted in opening 170, bulb 188 being inserted in opening 172, and pin 190 being inserted in opening 174. Nut 180 is threaded on stub 178 to secure housing 176 to plate 168 and then knob 27 is inserted in keyed relation on shaft 182. Sides 146 and 148 of channel 142 are then slightly spread and plate 168 is laterally slid into grooves 154, 156 until it is centered in extrusion 142 after which sides 146, 148 are released. The resilient compressive force between sides 146 and 148 will cause the slanted beds 158, 160 to contact the opposite edges of plate 168 forcing it in cammed relation against walls 162 and 164 to hold plate 168 in vibration-free relation to extrusion 142. Plates 196, 196a are then placed in position at the opposite ends of extrusion 142 and screws 198, 200 are threaded into openings 202, 204, respectively. Threaded openings 206, 206a in plates 196, 196a, respectively, receive mounting brackets, not shown, for secure mounting to the underside of the vehicle dashboard. Cutout 208 is formed in the lower edge of plate 196a to receive cable 192 and provide passage therefrom from housing 142. Due to the flat configuration of cable 192, it may be easily placed under the vehicle upholstery carpet and to and through shelf 32 for a connection to housing 42. Plate 74a has cutout 141 for receiving and providing passage for cable 120 therethrough.

Thus, a very sturdy, rigid, low cost, system is provided for indicating a CB selected channel to other CB operators who may wish to communicate with the operator of vehicle 20.

While there have been described above the principles of this invention in connection with specific apparatus, it is to be clearly understood that this description is made only by way of example and not as a limitation to the scope of the invention.

What is claimed is:

1. A digital readout device for use in a motor vehicle for indicating CB radio channel selection comprising:

first means manually adjustable by the radio operator for visually indicating a selected one of a plurality of channels to the vehicle operator;

second means for visually and digitally indicating said selected channel to persons exteriorly of the vehicle;

third means for electrically coupling said first means to said second means to vary the digital indication on said second means concurrently with and corresponding to the manual adjustment of said first means;

said second means comprises a plurality of concave surfaces each having a parabolic curve cross-section; a lamp having an elongated lamp filament axis generally parallel to the parabolic curve directrix and included within the parabolic curve;

said second means further comprises a channel-shaped display housing having a base and two generally parallel sides extending laterally from said base; said sides having opposing faces; each of the opposing faces on said sides having affixed thereto and protruding therefrom a respective elongated camming bar; said bars being affixed to their respective faces along a longitudinal bar surface; each bar having an arcuate cross-section; a second elongated bar protruding from each of said opposing face and generally parallel to and transversely spaced from the camming bar; each of said second bars having an abutment surface in facing relation to its respective camming bar; a reflector plate having generally parallel concave camming surfaces at opposite edges of one face thereof and a second opposite face; opposite edges of said opposite face registrable with said abutment surfaces, respectively; said camming surfaces being in camming relation to said camming bars to urge each of said second face opposite edges in compressive relation towards their respective abutment surfaces; a lamp support having a plurality of lamp pedestals protruding therefrom; said pedestals being in digit representing arrangement; a lamp being supported on and extending laterally from each of said pedestals; said plate having a plurality of openings provided substantially centrally of said concave surfaces; said openings being located in corresponding relation to said lamps for receiving said lamps; means positioned in said housing for holding said support in vibration-resistant relation against said plate.

2. The apparatus of claim 1 wherein the equation of said parabolic curve has a constant of 2.

3. The apparatus of claim 1 wherein said filament passes through the focus of said parabolic curve.

4. A digital readout device for use in a motor vehicle for indicating CB radio channel selection comprising:

first means manually adjustable by the radio operator for visually indicating a selected one of a plurality of channels to the vehicle operator;

second means for visually and digitally indicating said selected channel to persons exteriorly of the vehicle;

third means for electrically coupling said first means to said second means to vary the digital indication on said second means concurrently with and corresponding to the manual adjustment of said first means;

said second means comprises a channel-shaped display housing having a base and two generally parallel sides extending laterally from said base; said sides having opposing faces; each of the opposing faces on said sides having affixed thereto and protruding therefrom a respective elongate camming bar; said bars being affixed to their respective faces along a longitudinal bar surface; each bar having an arcuate cross-section; a second elongate bar protruding from each of said opposing faces and generally parallel to and transversely spaced from the camming bar; each of said second bars having an abutment surface in facing relation to its respective camming bar; a reflector plate having generally parallel concave camming surfaces at opposite edges of one face thereof and a second opposite face; opposite edges of said opposite face registrable with said abutment surfaces, respectively; said camming surfaces being in camming relation to said camming bars to urge each of said second face opposite edges in compressive relation towards their respective abutment surfaces.

5. The apparatus of claim 4 including a light conducting display panel being between said plate and said abutment surfaces; said display panel being held in cammed securement in said housing between said plate and said abutment surfaces.

6. A digital readout device for use in a motor vehicle for indicating CB radio channel selection comprising:

first means manually adjustable by the radio operator for visually indicating a selected one of a plurality of channels to the vehicle operator;

second means for visually and digitally indicating said selected channel to persons exteriorly of the vehicle;

third means for electrically coupling said first means to said second means to vary the digital indication on said second means concurrently with and corresponding to the manual adjustment of said first means;

said first means comprises a channel-shaped switch housing having a base and two generally parallel sides extending laterally from said base and having opposing faces; said opposing faces on said sides each having an elongate groove formed therein; said grooves being generally parallel and opposed; each of said grooves having a bed and generally laterally extending parallel walls; each of said beds being slanted relative to their respective groove walls; a switch plate being mounted in said housing transversely of said sides and having opposite edges extending respectively into said grooves; said plate edges being in cammed relation to the respective slanted beds against their respective groove walls to securely hold said plate in said housing.

* * * * *

UNITED STATES PATENT AND TRADEMARK OFFICE
CERTIFICATE OF CORRECTION

PATENT NO. : 4,112,376
DATED : September 5, 1978
INVENTOR(S) : Robert D. Fosnough and Max A. Nelson It is certified that error appears in the above-identified patent and that said Letters Patent are hereby corrected as shown below:

Col. 2, line 34, change "has" to -- the --.

Col. 2, line 33, change "was" to -- has --.

Claim 1, Col. 6, line 61, change "face and" to -- faces and --.

Signed and Sealed this

Seventeenth Day of July 1979

[SEAL]

Attest:

LUTRELLE F. PARKER

*Attesting Officer*   *Acting Commissioner of Patents and Trademarks*